(12) United States Patent
Cheung et al.

(10) Patent No.: US 10,264,720 B1
(45) Date of Patent: Apr. 16, 2019

(54) LEAD TRIMMING MODULE

(71) Applicant: Flextronics AP, LLC, Broomfield, CO (US)

(72) Inventors: Dason Cheung, Fremont, CA (US); Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 54 days.

(21) Appl. No.: 14/747,937

(22) Filed: Jun. 23, 2015

(51) Int. Cl.
| *H05K 13/04* | (2006.01) |
| *B26D 1/26* | (2006.01) |
| *B26D 7/18* | (2006.01) |
| *B26D 1/16* | (2006.01) |

(52) U.S. Cl.
CPC .......... *H05K 13/0473* (2013.01); *B26D 1/16* (2013.01); *B26D 7/1863* (2013.01); *Y10S 83/942* (2013.01); *Y10T 29/515* (2015.01)

(58) Field of Classification Search
CPC .............. Y10S 83/942; H05K 13/0473; H05K 13/0076; H05K 13/0092; H05K 13/023; B26D 1/26; B26D 5/12; B26D 7/1863; B26D 1/16; Y10T 83/207; Y10T 29/49135; Y10T 29/4914; Y10T 29/515
USPC ........................................................ 83/929.2
See application file for complete search history.

(56) References Cited

U.S. PATENT DOCUMENTS

| 3,953,920 | A |   | 5/1976  | Bergman |                |
|-----------|---|---|---------|---------|----------------|
| 4,165,557 | A | * | 8/1979  | Taguchi | H05K 13/0473   |
|           |   |   |         |         | 140/105        |
| 4,356,619 | A | * | 11/1982 | Snyder  | B23P 19/00     |
|           |   |   |         |         | 140/105        |
| 4,592,495 | A |   | 6/1986  | Toda    |                |
| 4,668,097 | A |   | 5/1987  | Nygren  |                |
| 4,691,419 | A | * | 9/1987  | Keeler  | H05K 13/0473   |
|           |   |   |         |         | 140/105        |
| 4,726,114 | A | * | 2/1988  | Staviski| H05K 13/0473   |
|           |   |   |         |         | 140/105        |
| 4,913,553 | A |   | 4/1990  | Falco   |                |
| 4,941,516 | A |   | 7/1990  | Weiswurm|                |
| 5,004,639 | A |   | 4/1991  | Desai   |                |
| 5,062,201 | A |   | 11/1991 | Long, Jr.|               |
| 5,499,745 | A |   | 3/1996  | Derian  |                |
| 5,560,531 | A |   | 10/1996 | Ruszowski|               |
| 5,614,986 | A |   | 3/1997  | Yoshikawa|               |
| 6,296,093 | B1|   | 10/2001 | Norris  |                |
| 6,315,164 | B1|   | 11/2001 | Muhlbauer|               |
| 6,541,712 | B1|   | 4/2003  | Gately  |                |
| 6,619,508 | B2|   | 9/2003  | Balcome |                |
| 6,804,579 | B1|   | 10/2004 | Laski   |                |
| 7,140,797 | B2|   | 11/2006 | Hunter  |                |

(Continued)

OTHER PUBLICATIONS

Final office action dated Jun. 27, 2017, U.S. Appl. No. 15/064,437, filed Mar. 8, 2016, applicant.: JL Zhou, 21 pages.

(Continued)

*Primary Examiner* — Evan H MacFarlane

(74) *Attorney, Agent, or Firm* — Haverstock & Owens LLP

(57) ABSTRACT

A lead trimming module and system provides automated means for trimming leads of a mounted electrical component. A controller executes a programmable lead trimming algorithm and correspondingly controls a movement apparatus, such as an XYZ gantry robot, and mounted lead trimming module for selectively trimming lead protrusions to a programmed lead length.

27 Claims, 3 Drawing Sheets

(56) References Cited

U.S. PATENT DOCUMENTS

| | | |
|---|---|---|
| 7,313,464 B1 | 12/2007 | Perreault |
| 8,042,445 B2 | 10/2011 | Lin |
| 8,192,198 B2 | 6/2012 | An |
| 8,222,537 B2 | 7/2012 | Dudnikov, Jr. |
| 8,302,301 B2 | 11/2012 | Lau |
| 8,444,025 B2 | 5/2013 | Greter |
| 8,519,270 B2 | 8/2013 | Chang |
| 8,528,785 B2 | 9/2013 | Naughton |
| 8,558,116 B2 | 10/2013 | Lee |
| 8,882,954 B2 | 11/2014 | Lee |
| 9,387,504 B2 | 7/2016 | Paetow, II |
| 9,624,023 B2 | 4/2017 | Williams |
| 9,884,329 B2 | 2/2018 | Pringle, IV |
| 2003/0164077 A1* | 9/2003 | Hill .................. B23Q 1/032 83/100 |
| 2003/0170553 A1 | 9/2003 | Eberlein |
| 2005/0214172 A1 | 9/2005 | Burgisser |
| 2007/0090128 A1 | 4/2007 | Martin |
| 2008/0217708 A1 | 9/2008 | Reisner |
| 2008/0253612 A1 | 10/2008 | Reyier |
| 2010/0181104 A1 | 7/2010 | Hotta |
| 2011/0135248 A1 | 6/2011 | Langer |
| 2012/0234587 A1 | 9/2012 | Nakamura |
| 2014/0261991 A1 | 9/2014 | Cucchi |
| 2015/0014029 A1 | 1/2015 | Iwayama |
| 2015/0047884 A1 | 2/2015 | Nagaura |
| 2015/0359149 A1* | 12/2015 | Itoh .................. H05K 13/0465 29/834 |
| 2016/0021762 A1 | 1/2016 | Kallman |
| 2016/0038655 A1 | 2/2016 | Weisman |
| 2017/0118879 A1* | 4/2017 | Nakanishi .......... H05K 13/0473 |

OTHER PUBLICATIONS

Non-Final Office Action, dated May 1, 2018, U.S. Appl. No. 15/159,665, filed May 19, 2016, Applicant: Jiawen Chen, 8 pages.

Non-Final Office Action, dated Nov. 28, 2017, U.S. Appl. No. 14/995,087, filed Jan. 13, 2016, Applicant: Pui Yin Yu, 11 pages.

Non-Final Office Action, dated Feb. 27, 2018, U.S. Appl. No. 15/807,793, filed Mar. 31, 2016, Applicant: Pui Yin Yu, 11 pages.

Non-Final Action, dated Oct. 2, 2018, U.S. Appl. No. 14/536,370, filed: Nov. 7, 2014, Applicant: Josef Kaiser, 22 pages.

Ayob et al., A Survey of Surface Mount Device Placement Machine Optimisation: Machine Classification , Sep. 2005 Computer Science Technical Report No: NOTTCS-TR-2005-8, 1-35 (Year: 2005), 35 pages.

Final Office Action, dated Dec. 6, 2018, U.S. Appl. No. 14/717,731, filed; May 20, 2015, Applicant: Dason Cheung, 37 pages.

* cited by examiner

LEAD TRIMMING MODULE

FIELD OF THE INVENTION

The present invention is generally directed to a device for lead trimming. More specifically, the present invention is directed to a device for trimming leads of components attached to double-sided printed circuit boards.

BACKGROUND OF THE INVENTION

Printed circuit boards (PCBs) are typically made of multiple layers of insulated and conductive materials. Electronic components are mounted to the PCB to form a printed circuit board assembly (PCBA). To mount an electronic component to the PCB, an electronic component includes components leads, or pins, which are inserted into plated through-holes (PTH) in the PCB. The leads are then mechanically and electrically connected to the PCB, such as by a filling the plated through holes with solder. Most PTH component leads are required to a specific lead length protruding from the back of the PCB per the industrial standard or customer specification. Even though most of the lead can be pre-trimmed at a preforming stage, it is usually necessary to trim the lead length to the required specification after mounting and soldering to the PCB to avoid solder short to the further assembly, for example a metal casing.

In the case of a single-sided PCB, components are mounted only on the top surface and a lead trimming machine is used to trim all the leads protruding from the back surface of the PCB in one single pass, as there are no components mounted on the back surface to interfere with this single pass process.

Surface mount technology (SMT) is an alternative mounting process where components are mounted or placed directly onto the surface of printed circuit boards (PCBs). Contacts on the component are mounted to corresponding contact pads on the surface of the PCB. A component may include short pins or leads of various styles, flat contacts, a matrix of solder balls (BGAs), or terminations on the body of the component for interconnecting with the corresponding contact pads on the PCB. Although SMT has largely replaced PTH technology for mounting components to a PCB, mixed technology applications are common where components are mounted to a common PCB using both SMT and PTH technology.

In many mixed technology applications, components are mounted on both surfaces of the PCB. Components mounted using PTH technology still require lead trimming. However, other components mounted onto the same surface of the protruding leads to be trimmed prohibit the use of the single pass process. Instead, a manual process is performed where a person using a lead trimming cutter manually cuts the protruding leads interspersed amongst the SMT components.

SUMMARY OF THE INVENTION

A lead trimming module and system provides automated means for trimming leads of a mounted electrical component. A controller executes a programmable lead trimming algorithm and correspondingly controls a movement apparatus, such as an XYZ gantry robot, and mounted lead trimming module for selectively trimming lead protrusions to a programmed lead length.

In an aspect, a lead trimming device, or module, is disclosed. The lead trimming device includes a lead trimmer, a pneumatic actuator coupled to the lead trimmer and a rotation motor assembly coupled to the lead trimmer. The lead trimmer is configured to cut a lead protruding from a component. The pneumatic actuator is configured to actuate the lead trimmer. The rotation motor assembly is configured to rotate the lead trimmer between a plurality of different cutting angles. In some embodiments, the lead protrudes at least partly in a Z-direction and the rotation motor assembly is configured to rotate the lead trimmer in an X-Y plane. In some embodiments, the rotation motor assembly comprises a rotation motor and a drive cam coupled to the rotation motor and to the lead trimmer. In some embodiments, the lead trimmer comprises a bracket having a first end and a second end, the first end coupled to the drive cam. In some embodiments, the second end of the bracket is free floating. In some embodiments, the lead trimmer further comprises a fixed cutting handle fixedly coupled to the bracket and a movable cutting handle movably coupled to the fixed cutting handle at a pivot point. In some embodiments, a first end of the fixed cutting handle and a first end of the movable cutting handle form a cutting head. In some embodiments, a second end of the movable cutting handle is coupled to the pneumatic actuator. In some embodiments, the lead trimming device also includes a trimmed lead collector positioned proximate a cutting end of the lead trimmer, wherein the trimmed lead collector is configured to receive a trimmed portion of the lead cut from the lead by the lead trimmer. In some embodiments, the lead trimming device also includes a vacuum hose coupled to the trimmed lead collector, wherein the vacuum hose is configured to remove the trimmed portion of the lead received by the trimmed lead collector. In some embodiments, the trimmed lead collector comprises a receptacle having a first opening configured to receive the trimmed portion of the lead cut from the lead and a second opening coupled to the vacuum hose.

In another aspect, a system for lead trimming is disclosed. The system includes a component having one or more leads to be trimmed, a gantry robot, a lead trimming device and a control module. The lead trimming device is coupled to the gantry robot. The lead trimming device includes a lead trimmer, a pneumatic actuator coupled to the lead trimmer and a rotation motor assembly coupled to the lead trimmer. The lead trimmer is configured to cut the one or more leads. The pneumatic actuator is configured to actuate the lead trimmer. The rotation motor assembly is configured to rotate the lead trimmer between a plurality of different cutting angles. The control module is coupled to the gantry robot and to the lead trimming device. In some embodiments, the gantry robot comprises an XYZ gantry robot. In some embodiments, the controller is configured to adjust a position of the lead trimmer for different lead length protrusions of the lead from the component. In some embodiments, the controller is coupled to the rotation motor assembly and is configured to control the rotation motor assembly so as to select the cutting angle. In some embodiments, the lead protrudes from the component at least partly in a Z-direction, and the lead trimmer is configured to rotate in an X-Y plane. In some embodiments, the rotation motor assembly comprises a rotation motor and a drive cam coupled to the rotation motor and to the lead trimmer. In some embodiments, the lead trimmer comprises a bracket having a first end and a second end, the first end coupled to the drive cam. In some embodiments, the second end of the bracket is free floating. In some embodiments, the lead trimmer further comprises a fixed cutting handle fixedly coupled to the bracket and a movable cutting handle movably coupled to the fixed cutting handle at a pivot point. In some embodiments, a first end of the fixed cutting handle and a first end of the movable cutting handle form a cutting head. In some embodiments, a second end of the movable cutting handle is coupled to the pneumatic actuator. In some embodiments, the system also includes a trimmed lead collector positioned proximate a cutting end of the lead trimmer, wherein the trimmed lead collector is configured to receive a trimmed portion of the lead cut from the lead by the lead trimmer. In some embodiments, the system also includes a vacuum hose coupled to the trimmed lead collector, wherein the vacuum hose is configured to remove the trimmed portion of the lead received by the trimmed lead collector. In some embodiments, the trimmed lead collector comprises a receptacle having a first opening configured to receive the trimmed portion of the lead cut from the lead and a second opening coupled to the vacuum hose. In some embodiments, the system also includes a camera coupled to the gantry robot.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a lead trimming module and system. Those of ordinary skill in the art will realize that the following detailed description of the lead trimming module and system is illustrative only and is not intended to be in any way limiting. Other embodiments of the lead trimming module and system will readily suggest themselves to such skilled persons having the benefit of this disclosure.

Reference will now be made in detail to implementations of the lead trimming module and system as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
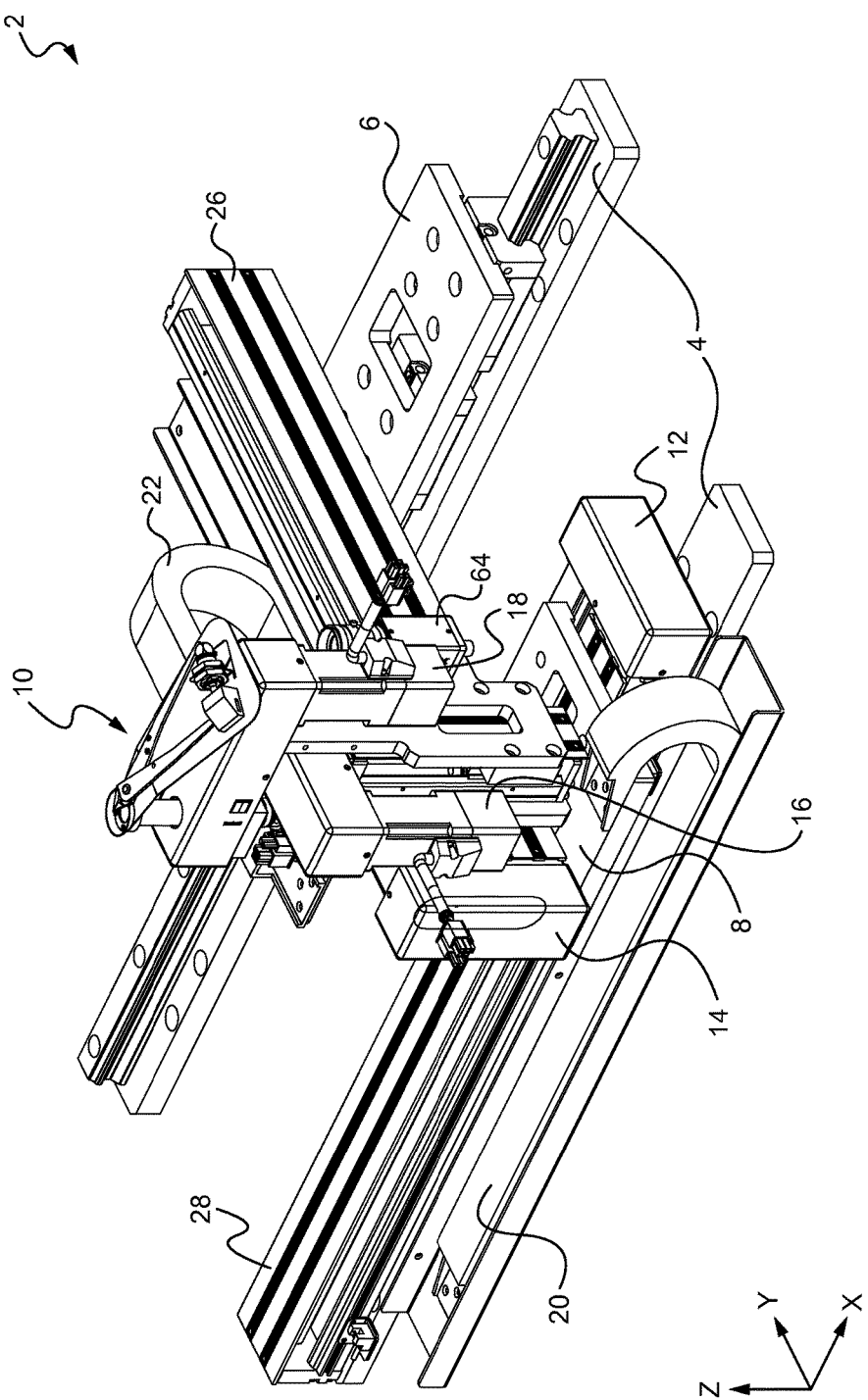
FIG. 1 illustrates a top down perspective view of a lead trimming system according to an embodiment.

FIG. 1 illustrates a top down perspective view of a lead trimming system according to an embodiment. The lead trimming system 2 includes a lead trimming module 10 mounted to a movement and mounting apparatus. In this exemplary embodiment, the movement and mounting apparatus is a XYZ gantry robot. It is understood that alternative apparatuses can be used to mount and move the lead trimming module 10. In some embodiments, the XYZ gantry robot is configured to move the lead trimming module 10 relative to a PCB (not shown) having one or more lead protrusions to be trimmed. It is understood that the lead trimming module 10 and the lead trimming system 2 can be used to trim leads protruding from electrical components other than those mounted to a PCB. In some embodiments, the PCB is secured in place and does not move while the lead trimming system 2 operates to cut the lead protrusions. In other embodiments, the PCB can be mounted to another movement and mounting apparatus so that both the PCB and lead trimming module can be independently moved relative to each other for proper alignment and cutting of each lead protrusion. In some embodiments, the PCB is positioned above the lead trimming system 2 with the lead protrusions extending downward. In this embodiment, the lead trimming system 2 is oriented as shown in FIG. 1. In other embodiments, the PCB is positioned below the lead trimming system 2 with the lead protrusions extending upward. In this embodiment, the lead trimming system 2 is rotated 180 degrees relative to the X-axis shown in FIG. 1. In some embodiments, the leads to be trimmed are leads of an electrical component mounted to a PCB using PTH technology.

The XYZ gantry robot includes an XYZ gantry robot base platform 4, mounting supports 6 and 8, an X-direction motor assembly 12, a Y-direction motor assembly 14 and a Z-direction motor assembly 16. The lead trimming module 10 is mounted to the Z-direction motor assembly 16. Each motor assembly includes a motor, cams, drive belt and movement track. The mounting support 8 is mounted to an X-direction movement track 28. The mounting support 6 is mounted to a first rail of the XYZ gantry robot base platform 4 and provides stability for a Y-direction movement track 26. The Y-direction movement track 26 and a Z-direction movement track (not shown) are mounted to the mounting support 8 and the mounting support 6. The X-direction movement track 28 is mounted to a second rail of the XYZ gantry robot base platform 4. The XYZ gantry robot base platform 4 is configured so as to enable movement of the lead trimming module 10 in the X, Y and Z directions in response to actuation of the X-direction motor assembly 12, the Y-direction motor assembly 14 and the Z-direction motor assembly 16, respectively. The X-direction motor assembly 12, the Y-direction motor assembly 14 and the Z-direction motor assembly 16 can each be operated independently, in unison, or in some combination.

The lead trimming system 2 also includes one or more electrical cables for providing control signaling and power to the X-direction motor assembly 12, the Y-direction motor assembly 14, the Z-direction motor assembly 16 and the lead trimming module 10. In the exemplary configuration shown in FIG. 1, the lead trimming system 2 includes an electrical cable carrier 20 and an electrical cable carrier 22 through which the electrical cables are positioned. It is understood that more, or less, than the two electrical cable carriers shown in FIG. 1 can be used to provide a greater, or a lesser, number of electrical cables or electrical cable bundles to the X-direction motor assembly 12, the Y-direction motor assembly 14, the Z-direction motor assembly 16 and the lead trimming module 10. Pneumatic hoses, described below, can also be positioned in the electrical cable carriers.

Figure 2:
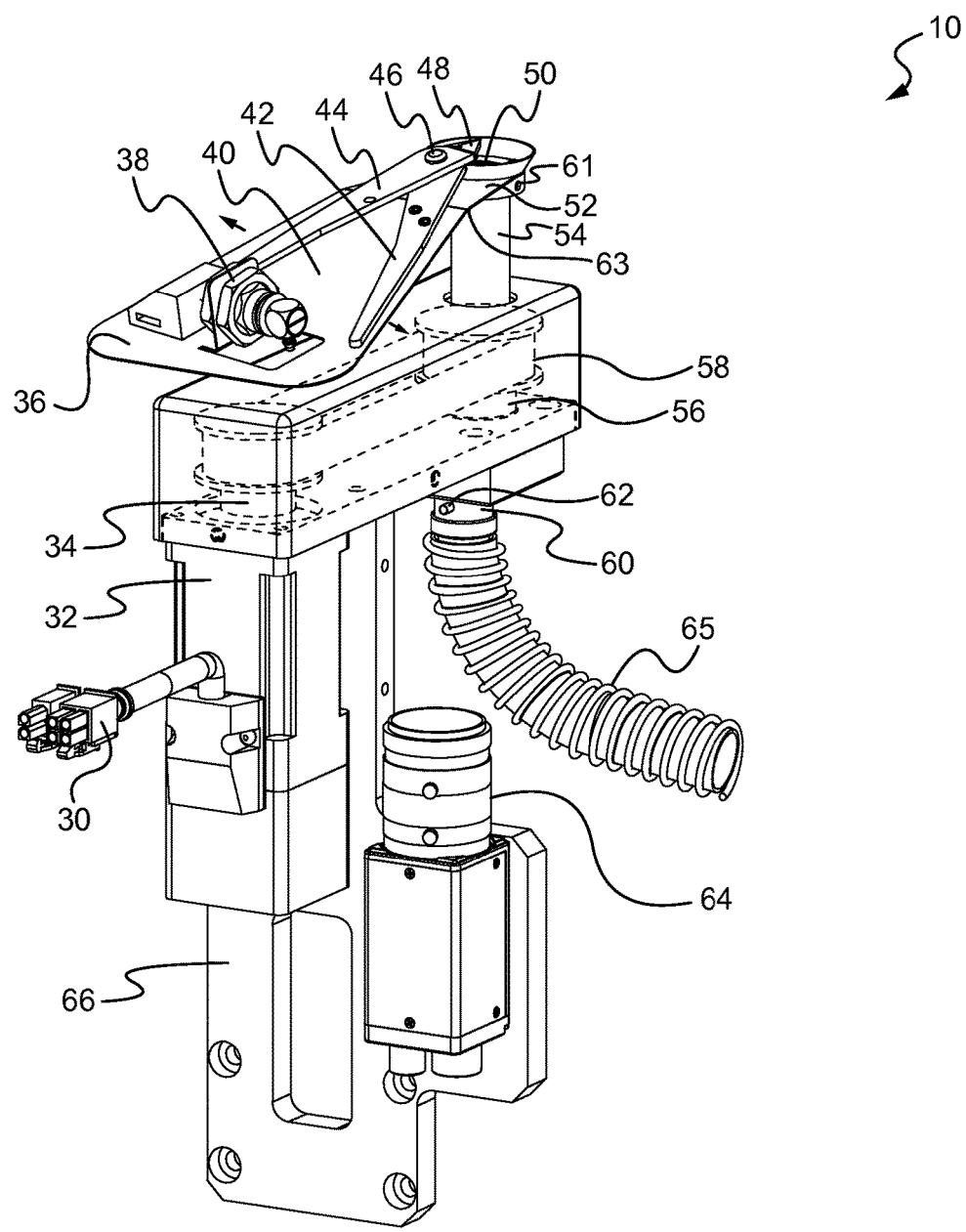
FIG. 2 illustrates the lead trimming module of FIG. 1.

FIG. 2 illustrates the lead trimming module 10 of FIG. 1. The lead trimming module 10 includes a mounting support 66, a rotation motor assembly, a collection tube 54, a camera 64 and a lead trimmer. The camera 64 and the rotation motor assembly are mounted to the mounting support 66. The rotation motor assembly includes a rotation motor 32, a cam 34, a drive belt 58 and a cam 56. The cam 34 is coupled to the rotation motor 32. The drive belt 58 is coupled to the cam 34 and the cam 56. Actuation of the rotation motor 32 translates to rotational movement of the cam 34. Rotation of the cam 34 is translated to rotation of the cam 56 by the drive belt 58. The collection tube 54 is coupled to the cam 56. Rotation of the cam 56 translates to rotational movement of the connection tube 54. The collection tube 54 is hollow and includes an opening 50 at a collection tube first end 61 and an opening (not shown) at a collection tube second end 60. A vacuum hose 65 is coupled to the collection tube second end 60.

The lead trimmer includes a bracket 40, a fixed cutting handle 42, a movable cutting handle 44 and a pneumatic actuator 38. The bracket 40 includes a bracket first end 52 and a bracket second end 36. The bracket first end 52 is fixedly coupled to the collection tube 54 at or proximate to the collection tube first end 61. The bracket second end 36 is free floating. Rotation of the collection tube 54 translates to rotational movement of the bracket 40. The fixed cutting handle 42 is fixedly coupled to the bracket 40. The movable cutting handle 44 is movable coupled to the fixed cutting handle 42 at a pivot point 46. The two ends of the fixed cutting handle 42 and the movable cutting handle 44 proximal to the pivot point 46 form a cutting head 48. A distal end of the movable cutting handle 44 is coupled to the pneumatic actuator 38. Actuation of the pneumatic actuator 38 translates to movement of the distal end of the movable cutting handle 44 and therefore rotational movement of the movable cutting handle 44 about the pivot point 46. Rotational movement of the movable cutting handle 44 results in opening and closing of the cutting head 48. In the exemplary configuration shown in FIG. 2, actuation of the pneumatic actuator 38 results in counter-clockwise rotation of the moveable cutting handle 44, thereby closing the cutting head 48. Release of the pneumatic actuator 38 results in clockwise rotation of the moveable cutting handle 44, thereby opening the cutting head 48. A spring (not shown) can be used to move the moveable cutting handle 44 in the clockwise direction when the pneumatic actuator 38 is released. A pneumatic actuator air hose 62 is coupled to the pneumatic actuator 38. In the exemplary configuration shown in FIG. 2, the pneumatic actuator air hose 62 enters the collection tube 54 at the collection tube second end 60 and exits the collection tube 54 at an opening 63. It is understood that the pneumatic actuator air hose 62 can be alternatively positioned so as to connect with the pneumatic actuator 38. An air compressor 72 (FIG. 3) is coupled to the pneumatic actuator air hose 62.

The cutting head 48 is moved into proper position for cutting each lead protrusion to a programmed lead length. The cutting head 48 is positioned by moving the lead trimming module 10 in the X, Y and Z direction using the X-direction motor assembly 12, the Y-direction motor assembly 14 and the Z-direction motor assembly 16, respectively. Depending on the configuration of the PCB and the relative position of the lead protrusion to be trimmed, the cutting head 48 may be rotated within the X-Y plane so that the cutting head 48 can access a desired lead protrusion interspersed amongst other components mounted on PCB. The cutting head 48 is rotated by actuating the rotation motor 32. The relative rotational position of the bracket 40, and therefore the cutting head 48, in the X-Y plane is referred to as the cutting angle. The cutting angle can be from 0-360 degrees.

Electrical connectivity is provided to the lead trimming module 10 by one or more electrical cables (not shown). An electrical connector 30 provides an electrical interface to the rotation motor 32. In some embodiments, a separate electrical connection is provided to the camera 64. The electrical connections provide power and control signaling to the rotation motor 32 and the camera 64. Although not shown in FIG. 2, an electrical connection for power and control is also provided to the air compressor that drives the pneumatic actuator 38.

Figure 3:
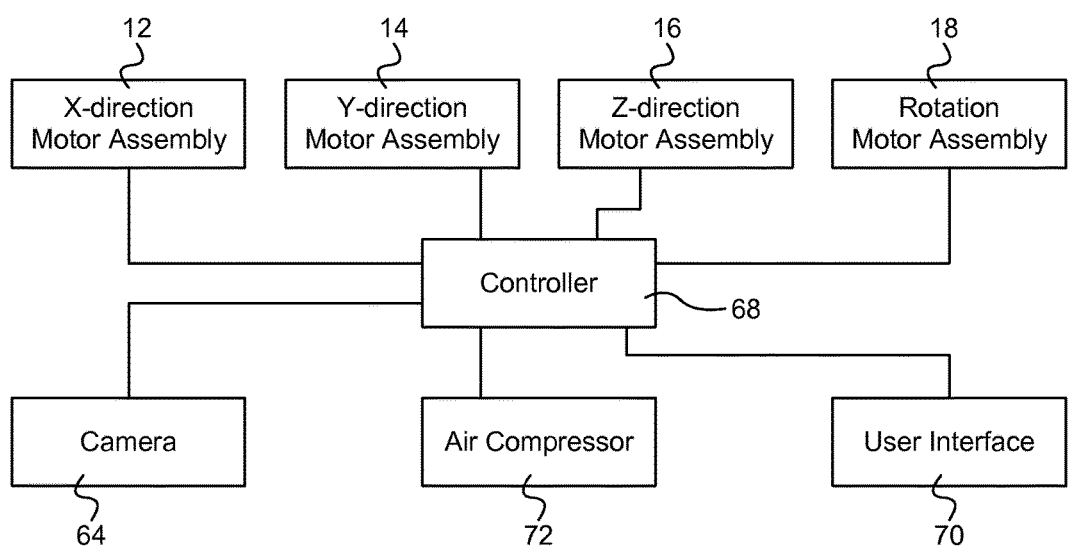
FIG. 3 illustrates a block diagram of a control structure of the lead trimming system according to an embodiment.

The lead trimming system 2 is an automated system for executing a lead trimming algorithm. The lead trimming system 2 includes a controller for executing the lead trimming algorithm and controlling the various components in the lead trimming system 2. FIG. 3 illustrates a block diagram of a control structure of the lead trimming system 2 according to an embodiment. A controller 68 is coupled to the X-direction motor assembly 12, the Y-direction motor assembly 14, the Z-direction motor assembly 16, the rotation motor assembly 18, the camera 64 and the air compressor 72. The lead trimming system 2 can also include a user interface 70, which is coupled to the controller 68.

Each PCB loaded for lead trimming by the lead trimming system 2 has a corresponding instruction set implemented by the controller using the lead trimming algorithm. The instruction set includes parameters for each lead protrusion on the PCB to be trimmed. The parameters for each lead protrusion include the X-Y coordinate for the lead protrusion, the lead length of the lead protrusion, and the cutting angle that enables access to the lead protrusion by the cutting head. These parameters are translated as movement instructions to the X-direction motor, the Y-direction motor, the Z-direction motor and the rotation motor for properly positioning the cutting head for trimming each lead protrusion.

In operation, the PCB is loaded proximate the lead trimming system 2, for example the PCB is positioned above the lead trimming system 2. The bottom surface of the PCB includes a plurality of fiducial location points. The lead trimming module 10 is moved to locate at least two of the fiducial location points using the camera 64. The X and Y location points of the lead trimming module 10 corresponding to the located fiducial location points are entered as reference points in the lead trimming algorithm executed by the controller. The Z-location point of the lead trimming module is established by referencing a conveyor position on which the PCB is loaded. The conveyor is part of the assembly system. The conveyor is positioned at a same location, such as by a mechanical stopper or a sensor, at which position the PCB is accessed by the lead trimming module 10. The reference points are used as offset data to determine the relative position of the lead trimming module 10 to the surface of the PCB. The controller executes the lead trimming algorithm using the entered reference points and the instruction set corresponding to the PCB to sequentially move the cutting head 48 to each lead protrusion to be trimmed, and trim each lead protrusion to the programmed lead length. Suction is applied to the collection tube 54 via the connected vacuum hose such that trimmed portions of the protruding leads are collected through the opening 50 of the collection tube 54. In some embodiments, the controller and camera are also programmed for post-trimming inspection to determine proper trimming of each lead protrusion. The instruction set used by the lead trimming algorithm is programmable for different lead protrusion lengths and different trimming angles to navigate around and to avoid damage to other mounted components, such as SMT components.

The present application has been described in terms of specific embodiments incorporating details to facilitate the understanding of the principles of construction and operation of the lead trimming module and system. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A lead trimming device comprising:
   a. a lead trimmer configured to cut a lead protruding from a component, wherein the lead trimmer comprises a bracket having a first end and a second end opposite the first end, wherein the lead trimmer further comprises a fixed cutting handle fixedly coupled to the bracket and a movable cutting handle movably coupled to the fixed cutting handle at a pivot point, further wherein the entire fixed cutting handle remains fixed in position relative to the bracket;
   b. a pneumatic actuator coupled to the lead trimmer, wherein the pneumatic actuator is configured to actuate the lead trimmer;
   c. a collection tube configured to receive a trimmed portion of the lead cut from the lead by the lead trimmer, wherein the collection tube comprises a first end and a second end opposite the first end of the collection tube, the first end of the collection tube directly connected to the first end of the bracket, further wherein an entirety of the lead trimmer is positioned externally to the collection tube; and
   d. a rotation motor assembly coupled to the lead trimmer, wherein the rotation motor assembly is configured to rotate the lead trimmer between a plurality of different cutting angles, wherein the rotation motor assembly comprises a rotation motor and a drive cam, the drive cam is coupled to the rotation motor and is rotatably connected to the collection tube.

2. The lead trimming device of claim 1 wherein the rotation motor assembly is configured to rotate the lead trimmer in an X-Y plane so as to access the lead protruding at least partly in a Z-direction.

3. The lead trimming device of claim 1 wherein the bracket is planar.

4. The lead trimming device of claim 1 wherein the pneumatic actuator is directly connected to the lead trimmer.

5. The lead trimming device of claim 1 wherein the second end of the bracket is free floating.

6. The lead trimming device of claim 1 wherein the collection tube has a circular cylindrical shape.

7. The lead trimming device of claim 1 wherein a first end of the fixed cutting handle and a first end of the movable cutting handle form a cutting head.

8. The lead trimming device of claim 7 wherein a second end of the movable cutting handle is coupled to the pneumatic actuator.

9. The lead trimming device of claim 7 wherein the first end of the collection tube comprises an opening positioned proximate the cutting head of the lead trimmer.

10. The lead trimming device of claim 9 further comprising a vacuum hose coupled to the second end of the collection tube, wherein the second end of the collection tube has an opening and the vacuum hose is configured to remove the trimmed portion of the lead received by the collection tube.

11. A lead trimming device comprising:
   a. a lead trimmer configured to cut a lead protruding from a component, wherein the lead trimmer comprises a bracket having a first end and a second end opposite the first end;
   b. a pneumatic actuator coupled to the lead trimmer, wherein the pneumatic actuator is configured to actuate the lead trimmer;
   c. a collection tube configured to receive a trimmed portion of the lead cut from the lead by the lead trimmer, wherein the collection tube comprises a first end and a second end opposite the first end of the collection tube, the first end of the collection tube directly connected to the first end of the bracket, further wherein an entirety of the lead trimmer is positioned externally to the collection tube; and
   d. a rotation motor assembly coupled to the lead trimmer, wherein the rotation motor assembly is configured to rotate the lead trimmer between a plurality of different cutting angles, wherein the rotation motor assembly comprises a rotation motor and a drive cam, the drive cam is coupled to the rotation motor and is rotatably and directly connected to the collection tube.

12. A system for lead trimming, the system comprising:
   a. a gantry robot;
   b. a lead trimming device coupled to the gantry robot, the lead trimming device comprising:
      i. a lead trimmer configured to cut a lead protruding from a component, wherein the lead trimmer comprises a bracket having a first end and a second end opposite the first end, wherein the lead trimmer further comprises a fixed cutting handle fixedly coupled to the bracket and a movable cutting handle movably coupled to the fixed cutting handle at a pivot point, further wherein the entire fixed cutting handle remains fixed in position relative to the bracket;
      ii. a pneumatic actuator coupled to the lead trimmer, wherein the pneumatic actuator is configured to actuate the lead trimmer;
      iii. a collection tube configured to receive a trimmed portion of the lead cut from the lead by the lead trimmer, wherein the collection tube comprises a first end and a second end opposite the first end of the collection tube, the first end of the collection tube directly connected to the first end of the bracket, further wherein an entirety of the lead trimmer is positioned externally to the collection tube; and
      iv. a rotation motor assembly coupled to the lead trimmer, wherein the rotation motor assembly is configured to rotate the lead trimmer between a plurality of different cutting angles, wherein the rotation motor assembly comprises a rotation motor and a drive cam, the drive cam is coupled to the rotation motor and is rotatably connected to the collection tube; and
   c. a control module coupled to the gantry robot and to the lead trimming device.

13. The system of claim 12 wherein the gantry robot comprises an XYZ gantry robot.

14. The system of claim 12 wherein the control module is configured to adjust a position of the lead trimmer for different lead length protrusions of the lead from the component.

15. The system of claim 12 wherein the control module is coupled to the rotation motor assembly and is configured to control the rotation motor assembly so as to select the cutting angle.

16. The system of claim 12 wherein the lead trimmer is configured to rotate in an X-Y plane so as to access the lead protruding at least partly in a Z-direction.

17. The system of claim 12 further comprising a camera coupled to the lead trimming device.

18. The lead trimming device of claim 12 wherein the bracket is planar.

19. The system of claim 12 wherein the second end of the bracket is free floating.

20. The system of claim 12 wherein a first end of the fixed cutting handle and a first end of the movable cutting handle form a cutting head.

21. The system of claim 20 wherein a second end of the movable cutting handle is coupled to the pneumatic actuator.

22. The system of claim 20 wherein the first end of the collection tube comprises an opening positioned proximate the cutting head of the lead trimmer.

23. The system of claim 22 further comprising a vacuum hose coupled to the second end of the collection tube, wherein the second end of the collection tube has an opening and the vacuum hose is configured to remove the trimmed portion of the lead received by the collection tube.

24. A lead trimming device comprising:
   a. a lead trimmer configured to cut a lead protruding from a component, wherein the lead trimmer comprises a bracket having a first end and a second end opposite the first end;
   b. a pneumatic actuator coupled to the lead trimmer, wherein the pneumatic actuator is configured to actuate the lead trimmer;
   c. a collection tube configured to receive a trimmed portion of the lead cut from the lead by the lead trimmer, wherein the collection tube comprises a first end and a second end opposite the first end of the collection tube, the first end of the collection tube directly connected to the first end of the bracket, further wherein an entirety of the lead trimmer is positioned externally to the collection tube; and
   d. a rotation motor assembly coupled to the lead trimmer, wherein the rotation motor assembly is configured to rotate the lead trimmer between a plurality of different cutting angles, wherein the rotation motor assembly comprises a rotation motor and a drive cam, the drive cam is coupled to the rotation motor and is rotatably connected to the collection tube, further wherein the drive cam, collection tube and bracket are configured such that rotation of the drive cam translates to rotation of the collection tube about a central axis of the collection tube, and rotation of the collection tube translates to angular rotation of the second end of the bracket about the central axis of the collection tube which changes the cutting angle of the lead trimmer.

25. The lead trimming device of claim 24 wherein the first end of the bracket is fixedly coupled to the first end of the collection tube, and rotation of the collection tube translates to a matching rotation of the first end of the bracket and the collection tube.

26. A system for lead trimming, the system comprising:
   a. a gantry robot;
   b. a lead trimming device coupled to the gantry robot, the lead trimming device comprising:
      i. a lead trimmer configured to cut a lead protruding from a component, wherein the lead trimmer comprises a bracket having a first end and a second end opposite the first end;
      ii. a pneumatic actuator coupled to the lead trimmer, wherein the pneumatic actuator is configured to actuate the lead trimmer;
      iii. a collection tube configured to receive a trimmed portion of the lead cut from the lead by the lead trimmer, wherein the collection tube comprises a first end and a second end opposite the first end of the collection tube, the first end of the collection tube directly connected to the first end of the bracket, further wherein an entirety of the lead trimmer is positioned externally to the collection tube; and
      iv. a rotation motor assembly coupled to the lead trimmer, wherein the rotation motor assembly is configured to rotate the lead trimmer between a plurality of different cutting angles, wherein the rotation motor assembly comprises a rotation motor and a drive cam, the drive cam is coupled to the rotation motor and is rotatably connected to the collection tube, further wherein the drive cam, collection tube and bracket are configured such that rotation of the drive cam translates to rotation of the collection tube about a central axis of the collection tube, and rotation of the collection tube translates to angular rotation of the second end of the bracket about the central axis of the collection tube which changes the cutting angle of the lead trimmer; and
   c. a control module coupled to the gantry robot and to the lead trimming device.

27. The lead trimming device of claim 26 wherein the first end of the bracket is fixedly coupled to the first end of the collection tube, and rotation of the collection tube translates to a matching rotation of the first end of the bracket and the collection tube.

* * * * *